Oct. 25, 1966 W. C. FOLZ ETAL 3,281,715
LINEAR VOLTAGE CONTROLLED VARIABLE FREQUENCY MULTIVIBRATOR
Filed March 31, 1964
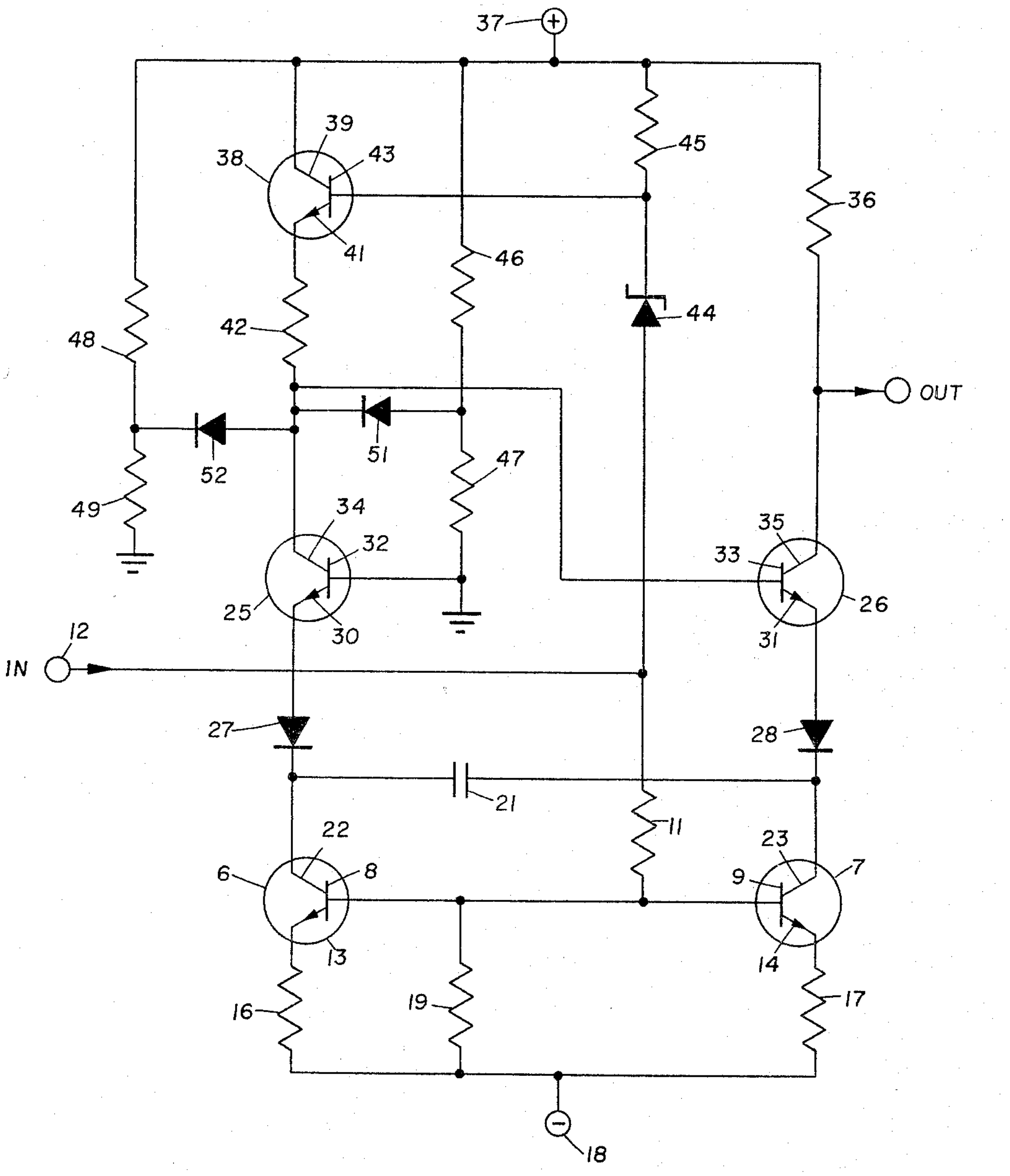
Walter C. Folz
Walter H. Elder
INVENTORS.
BY [signature] ATTORNEY.
Frank T. Nieman AGENT.

United States Patent Office 3,281,715

Patented Oct. 25, 1966

3,281,715

LINEAR VOLTAGE CONTROLLED VARIABLE FREQUENCY MULTIVIBRATOR

Walter C. Folz, Hyattsville, and Walter H. Elder, Silver Spring, Md., assignors to the United States of America as represented by the Secretary of the Navy Filed Mar. 31, 1964, Ser. No. 356,327

4 Claims. (Cl. 331—113)

The invention described herein may be manufactured and used by or for the Government of the United States of America for governmental purposes without the payment of any royalties thereon or therefor.

The present invention relates to transistorized oscillators and more particularly to a variable frequency oscillator in which there is a linear relationship between the output frequency and the input control voltage.

Prior art transistorized oscillators are generally similar in construction but they have had some serious defects. One type of prior art oscillator varies the frequency inversely with the input voltage. The inverse relationship between the control voltage and the output frequency has serious disadvantages in that the frequency range over which this oscillator may be used is limited, since a linear relationship does not exist between the input voltage and the output frequency. A circuit that produces an output frequency that is linear and directly proportional to the input voltage requires considerable rearrangement of both the circuitry as well as the principles of operation. This rearrangement, as shown in the prior art, results in a considerable increase in the number of components necessary to obtain the desired result.

The present invention produces the desired linear output with few components by modifying the typical constant current multivibrator. An input control voltage is applied to the bases of a pair of transistors to vary the normally constant current oscillator section. This change in the constant current oscillator section changes the parameters of other portions of the circuitry. The present invention also utilizes the input voltage to control a variable impedance means to maintain the parameters of the circuitry constant.

An object of the present invention is to provide a transistorized multivibrator oscillator having the capability of controlling the output frequency in a direct linear relationship to the input control voltage.

Another object of the present invention is to provide a compensating network to maintain some of the circuit parameters in a transistorized multivibrator oscillator constant while simultaneously altering other parameters.

A still further object of the present invention is to provide a new and improved circuitry which utilizes a minimum of components to produce a linear voltage controlled oscillator having wide frequency range as well as good stability.

Other objects, advantages and novel features of the invention will become apparent from the following detailed description of the invention, when considered in conjunction with the accompanying drawing wherein:

The figure is a schematic diagram of the circuitry utilized in the oscillator.

Referring to the figure there is shown a first pair of NPN transistors 6 and 7, which act to control the current in accordance with the magnitude of the input voltage. The base electrodes 8 and 9 are connected together and through resistor 11 receive the input voltage applied to input terminal 12. Emitters 13 and 14 of this first pair of transistors are also connected together through a pair of current limiting resistors 16 and 17 to a terminal 18 adapted to be connected to a negative source of voltage. A biasing resistor 19 connects the bases 8, 9 of the transistors to the negative terminal 18. A capacitor 21 is connected across the collectors 22 and 23 of the first pair of transistors which acts to alternate the conduction of transistors 6 and 7.

The second pair of NPN transistors 25 and 26 are connected in series with the first set of transistors 6 and 7 and to act as a switching means. A pair of diodes 27 and 28 each have their cathode connected to a different collector of the first pair of transistors and their anode connected to a different emitter 30 and 31 of the second pair of transistors 25 and 26. The diodes prevent an excess voltage from being applied to the emitters 30 and 31. The base 32 of transistor 25 is connected to ground while the base 33 of transistor 26 is connected to the collector 34 of transistor 25. The collector 35 of transistor 26 is connected through biasing resistor 36 to the positive terminal 37 which is adapted to be connected to an appropriate power supply. Another NPN transistor 38 has its collector 39 connected to the positive terminal 37 and the emitter 41 is connected in series with resistor 42 to the collector 34 of transistor 25. The base 43 of transistor 38 is connected to the junction of a cathode of a Zener diode 44 and a biasing resistor 45. The anode of the Zener diode 44 is connected to the input terminal 12 so that the positive input signal applied, through terminal 12 and Zener diode 44, to the base 43 of transistor 38 thereby enabling the transistor to operate as a variable impedance means.

A pair of voltage dividing networks is connected between the positive terminal 37 and ground and comprises resistors 46–49. An anode of diode 51 is connected to the junction between resistors 46 and 47 and the cathode is connected to the collector 34 of transistor 25. In a similar manner the cathode of diode 52 is connected to the junction between resistors 48 and 49 and the anode is connected to the collector 34.

In operation an input voltage applied to the input terminal 12 would be applied to the bases 8 and 9 of the transistors 6 and 7. The input voltage, depending upon its magnitude, would raise or lower the biased potential on the bases 8 or 9 and would cause an increase or decrease of the current in the transistors 6 and 7. The capacitor 21 together with the second pair of transistors 25 and 26 control the switching rate of the oscillator. Assume that a positive voltage is applied to the bases 8 and 9 of transistors 6 and 7 respectively, either through an input voltage or the bias produced from voltage dividing network of terminal 37, resistor 45, Zener diode 44, resistors 11 and 19 and terminal 18. Further assume that transistor 26 is conductive so that current is flowing from positive terminal 37 through resistor 36 into collector 35 and out emitter 31 of transistor 26. Further assume that this would cause conduction of diode 28 and the current would flow through transistor 7 to the negative terminal 18. In connection with this current flow the capacitor 21 would become charged positively on the conductive side, while on the nonconductive side, that is, the side with transistor 25, the capacitor would become negatively charged. At the point at which the emitter 30 of transistor 25 becomes more negative than the base 32, transistor 25 will conduct. This conduction will suddenly reduce the voltage on the collector 34 of transistor 25, thus reducing the voltage applied to the base 33 of transistor 26. The decrease in voltage to the base of transistor 26 would cause a reduction in conduction of transistor 26 and would cause the positive charge stored on the capacitor 21 to flow through the conducting transistor 7. Thus, the capacitor would then be recharged in the opposite direction from that in the prior cycle. As the emitter 31 becomes more negative than the base of transistor 26, transistor 26 would initiate conduction once again and the cycle would be repeated.

The diodes 51 and 52 clamp the voltage on collector 34 of transistor 25. If the potential on collector 34 becomes excessively positive, diode 52 will conduct to clamp the voltage at that present between the voltage dividing network of resistors 48 and 49. In a similar manner, if the voltage on the collector 34 becomes excessively negative, diode 51 will conduct to clamp the voltage at that point existing at the junction of resistors 46 and 47.

Diodes 51, 52 clamp the operating voltage point of collector 34 to a broad range but there is still variation in the voltage present on collector 34. The main reason for this variation is the fact that the input voltage increases or decreases the current in each leg of the oscillator by varying the bias on the base of transistors 6 and 7. This variation in current in the circuit from positive source potential 37 through transistor 38 and resistor 42 will cause a variation of the potential present at the collector 34 of transistor 25. This voltage is critical since it is the bias on base 33 of transistor 26. In order to have a linear change in frequency with respect to the input voltage, it is necessary that this voltage be maintained as constant as possible. When a positive input voltage on input terminal 12 increases the conductivity of transistor 6, it is simultaneously applied to the base 43 of transistor 38. This increases the conductivity of transistor 38 and reduces the voltage drop across the transistor 38 to compensate for the increase in voltage drop across the resistor 42. Thus, the operating point of the collector 34 is maintained more constant. The diodes 51 and 52 can be considered as a coarse voltage clamping or regulating system and the combination of the transistor 38 and the resistor 42 can be considered a vernier or variable voltage control system.

The Zener diode 44 maintains the voltage on the base 43 of transistor 38, as supplied from the power supply through terminal 37, relatively constant for a given constant input voltage on 12. When a change in input voltage is received on terminal 12 it is then applied to base 33 through Zener diode 44. It is also applied through the voltage dividers 11 and 19 to bases 8 and 9, thus producing a corresponding change in the conduction of transistors 6 and 7 and hence in the rate of discharge of capacitor 21. The Zener diode broadly sets the frequency range of the oscillator and incremental changes in frequency are produced by the relatively small input voltages.

The variable frequency oscillator has a relatively wide frequency range and good stability. The frequency change is directly proportional, in a linear manner, to an input voltage which simultaneously changes the amount of current flowing in one section of a circuit to increase or decrease the charging rate and discharging rate of a capacitor.

Obviously many modifications and variations of the present invention are possible in the light of the above teachings. It is therefore to be understood that within the scope of the appended claims the invention may be practiced otherwise than as specifically described.

What is claimed is:

1. A linear voltage controlled oscillator comprising, a first pair of NPN transistors each having an emitter electrode connected to a terminal for negative potential, a base electrode connected to an input terminal and a collector electrode, a capacitor having a pair of terminals, a second pair of NPN transistors each having an emitter electrode connected to a different terminal of said capacitor and a different collector electrode of said first pair of NPN transistors, a base electrode and a collector electrode, the base of one transistor being connected to the collector of the other transistor and the base of the other said transistor being connected to a reference potential, the collector of said one transistor being connected to a terminal for positive potential and an output terminal, and a fifth NPN transistor having a collector electrode connected to the terminal for positive potential, an emitter connected to the collector electrode of the other transistor of said second pair of NPN transistors, and a base electrode connected to the input terminal, whereby an input voltage applied to the input terminal directly varies the output frequency of the oscillator and inversely varies the voltage drop across said other NPN transistor of said second pair of transistors by varying the current conduction of said first pair of NPN transistors and said other NPN transistor.

2. Apparatus as recited in claim 1 further comprising in the fifth transistor base electrode to input terminal connection a Zener diode having an anode connected to the input terminal and a cathode connected to the base of said fifth NPN transistor.

3. Apparatus as recited in claim 1 further comprising a voltage clamping means connected to the collector electrode of said other transistor of said second pair of NPN transistors for maintaining the voltage relatively constant.

4. Apparatus as recited in claim 3 wherein said voltage clamping means comprises a pair of diodes each having an anode and a cathode, the cathode of one and the anode of the other being connected to the collector electrode of said other transistor of said second pair of NPN transistors, and a pair of voltage dividing means connected in parallel between the terminal for positive potential and the reference potential, the anode of the one diode being connected to one voltage dividing means and the cathode of the other diode being connected to the other voltage dividing means.

References Cited by the Examiner

UNITED STATES PATENTS 3,061,799 10/1962 Biard ---------- 331—113 X
3,129,391 4/1964 Kabell ---------- 331—113 X

OTHER REFERENCES

Michels et al., The International Dictionary of Physics and Electronics, Van Nostrand, N.J., 1956; pages 382, 383.

ROY LAKE, *Primary Examiner.*

S. H. GRIMM, *Assistant Examiner.*